United States Patent [19]

Reits

[11] Patent Number: 5,159,295

[45] Date of Patent: Oct. 27, 1992

[54] MICROWAVE VECTOR MODULATOR AND DEVICE FOR MATCHING A MICROWAVE LOAD

[75] Inventor: Bernard J. Reits, Hengelo, Netherlands

[73] Assignee: Hollandse Signaalapparaten B.V., Hengelo, Netherlands

[21] Appl. No.: 714,620

[22] Filed: Jun. 13, 1991

[30] Foreign Application Priority Data

Jun. 28, 1990 [NL] Netherlands ........................ 9001477

[51] Int. Cl.$^5$ ............................................. H03H 7/40
[52] U.S. Cl. ................................... 333/17.3; 332/152;
332/164; 333/81 B
[58] Field of Search .................. 333/17.1, 17.3, 81 B,
333/258; 332/152, 164, 105

[56] References Cited

U.S. PATENT DOCUMENTS

| | | | |
|---|---|---|---|
| 2,928,056 | 3/1960 | Lampert | 332/164 |
| 2,978,652 | 4/1961 | Thomas | 332/152 |
| 3,121,203 | 2/1964 | Heywang | 332/164 X |
| 3,465,266 | 9/1969 | Dixon, Jr. | 333/17.1 |
| 3,573,660 | 4/1971 | Garver et al. | 332/164 |
| 4,493,112 | 1/1985 | Bruene | 333/17.3 X |
| 5,099,214 | 3/1992 | Rosen et al. | 333/258 X |

FOREIGN PATENT DOCUMENTS

| | | |
|---|---|---|
| 0372641 | 6/1990 | European Pat. Off. . |
| 234494 | 1/1969 | U.S.S.R. ............................ 332/164 |

OTHER PUBLICATIONS

The Record of the IEEE 1990 International Radar Conference, May 7–10, 1990, N.Y., USA, pp. 391–395; P. D. L. Beasley et al.: "Solving the Problems of a Single Antenna Frequency Modulated CW Radar".

Primary Examiner—Paul Gensler
Attorney, Agent, or Firm—Oblon, Spivak, McClelland, Maier & Neustadt

[57] ABSTRACT

A microwave vector modulator (4) of the reflective type is used to match a microwave load. The adjustable reflection of the vector modulator is obtained by semiconducting surfaces (18, 19, 20, 21), illuminated by light-emitting means (24, 25, 26, 27).

33 Claims, 2 Drawing Sheets

MICROWAVE VECTOR MODULATOR AND DEVICE FOR MATCHING A MICROWAVE LOAD

BACKGROUND OF THE INVENTION

The invention relates to a microwave vector modulator provided with a transmission line, to an input of which microwave radiation can be applied, and adjustable reflection means for adjustably reflecting at least part of the microwave radiation applied to the input.

The invention also relates to a device for the matching of a microwave load comprising a microwave source, a microwave load, a transmission line through which microwave radiation generated by the microwave source is applied to the microwave load, a vector modulator incorporated in the transmission line, with which an adjustable part of the microwave radiation generated by the microwave source can be reflected, and a quadrature detector to which at least part of the microwave radiation reflected by the microwave load and vector modulator is applied and to which also part of the microwave radiation generated by the microwave source is applied, whereby the quadrature detector controls the vector modulator so that a closed loop is obtained with which the microwave radiation reflected by the microwave load and vector modulator is cancelled out.

A vector modulator and its application in a device for cancelling reflections at a microwave load are known from the contribution of P. D. L. Beasley et al. at the International Radar Conference 1990, Washington. Mr. Beasley describes a CW radar installation which employs a single antenna for simultaneous transmitting and receiving. This necessitates the use of a vector modulator which in a closed loop compensates for reflections of microwave radiation at the antenna. It should be noted that actually it is not matching of a microwave load that is at issue here, but the prevention of reflections from penetrating into the receiver branch.

This solution permits a low-power vector modulator to be employed, whose internal losses can practically be ignored.

SUMMARY OF THE INVENTION

The invention described relates to a low-loss vector modulator which can handle large amounts of energy. It is therefore characterised in that the adjustable reflection means are provided with semiconducting surfaces incorporated in the transmission line and light-emitting means for the adjustable generation of a quantity of light with which the semiconducting surfaces are illuminated so as to obtain an adjustable reflection.

It is moreover characterised in that the vector modulator is provided with semiconducting surfaces incorporated in the transmission line and light-emitting means for the adjustable generation of a quantity of light with which the semiconducting surfaces are illuminated so as to obtain an adjustable reflection.

BRIEF DESCRIPTION OF THE DRAWINGS

Below, the invention is explained in detail with reference to the following figures.

DESCRIPTION OF THE PREFERRED EMBODIMENTS

Figure 1:
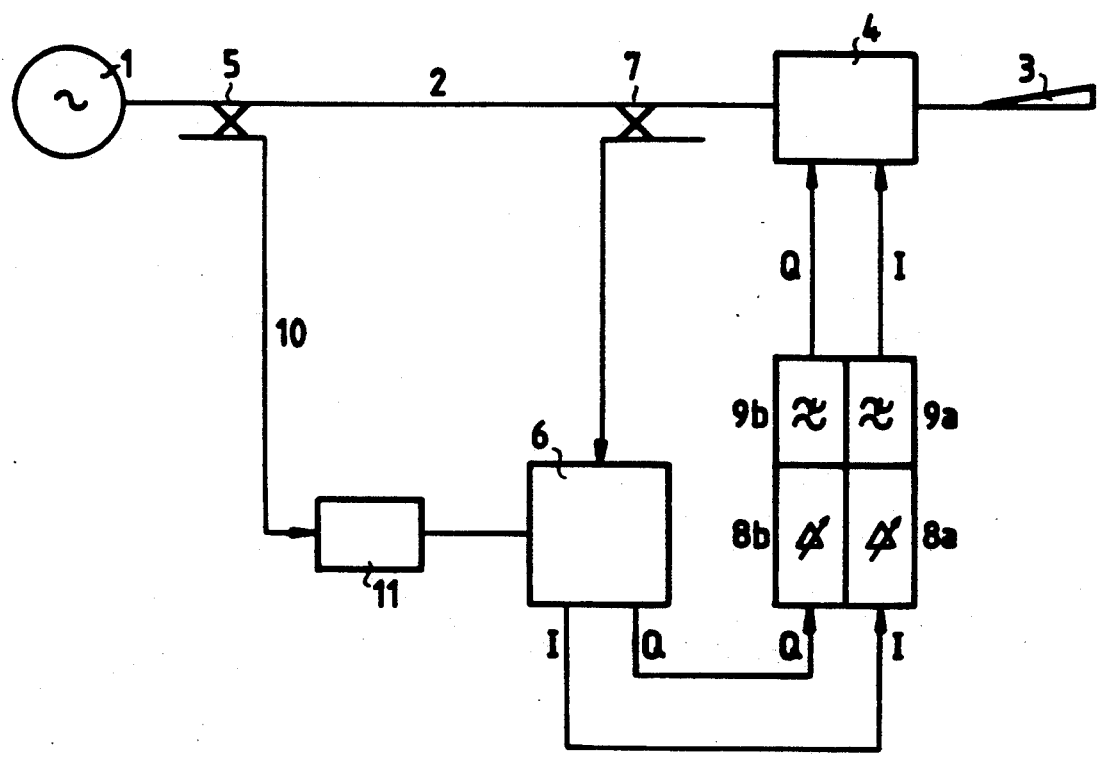
FIG. 1 is a schematic diagram of the matching of a microwave load in which a vector modulator according to the invention is applied.

In FIG. 1, marked by reference number 1, a microwave source is represented which through a transmission line 2 applies microwave radiation ot a microwave load 3. Incorporated in the transmission line is a vector modulator 4, a first coupler 5 which diverts part of the radiation generated by the microwave source and applies it as a reference signal to a quadrature detector 6, and a second coupler 7 which diverts at least part of the microwave energy reflected by the microwave load 3 and the vector modulator 4, and applies it to the quadrature detector 6. The inphase output signal I and the quadrature output signal Q of the quadrature detector 6 fully characterise the combined reflection of the microwave load 3 and the vector modulator 4. The elements mentioned so far, such as the microwave source 1, the transmission line 2, the microwave load 3, the coupler 5, the quadrature detector 6, and the coupler 7, are all known within the field of microwave technology.

The vector modulator 4 has two control inputs, an in-phase control input I and a quadrature input Q, which are connected with the in-phase output I and the quadrature output Q of the quadrature detector 6 via, respectively the amplifiers $8a$, $8b$ and the low-pass filters $9a$, $9b$. In a line 10, through which the reference signal is applied to the quadrature detector 6, a phase shifter 11 is incorporated, with which the relative phase of the reference signal can be adjusted such that the just described configuration forms a closed loop, with which the combined reflection of the vector modulator 4 and the microwave load 3 is adjusted to zero. To achieve a specific adjustment behaviour, the loop gain and the loop bandwidth can be entirely selected in conformity with established theory in the field of control engineering, given a required step response and an acceptable residual reflection.

Figure 2:
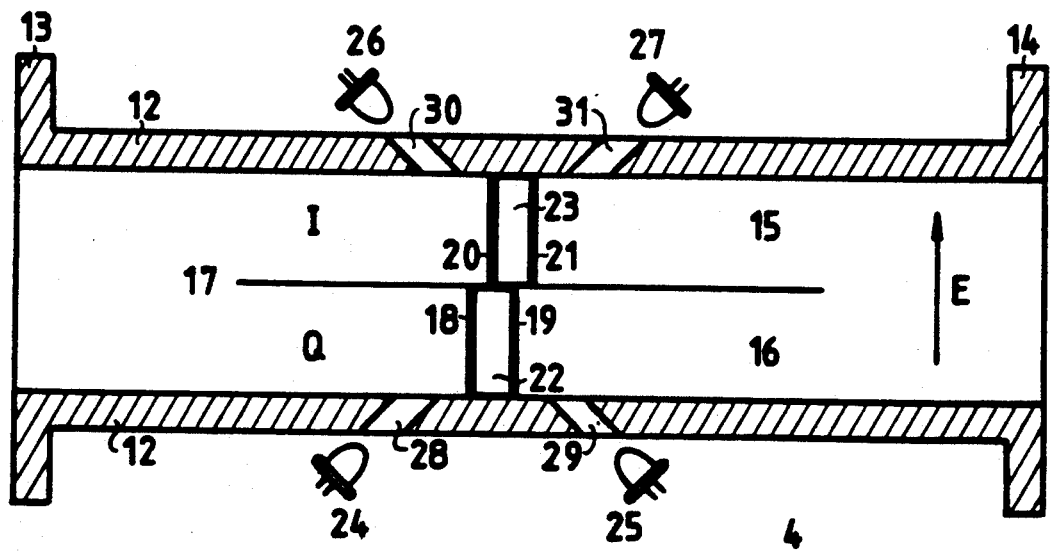
FIG. 2 is a cross-section of the vector modulator.

In FIG. 2 an embodiment of the vector modulator 4 is represented. The vector modulator 4 is accommodated in a transmission line 12 having connecting flange 13 as its input and connection flange 14 as its output. The transmission line 12 has been divided into two compartments 15 and 16 by a partition 17 which is tapered in a manner well-known in the field such that at the partition substantially no reflections arise. The adjustable reflection occurs at four semiconducting surfaces 18, 19, 20, 21. The semiconducting surfaces 18 and 19 are fixed to a spacer element 22 of, for example, plastic foam such that their distance apart is approximately $$\frac{k \cdot \lambda}{4} \quad (k = 1, 3, 5, \ldots)$$

where $\lambda$ is the wavelength of the microwave radiation in the transmission line; they are accommodated in the compartment 16. The semiconducting surfaces 20 and 21 are fixed to a spacer element 23 of, for example, plastic foam such that their distance apart is approximately $$\frac{k \cdot \lambda}{4} \quad (k = 1, 3, 5, \ldots);$$

they are accommodated in the compartment 15. The spacer elements 22 and 23 are shifted, relative to the propagation direction of the microwave radiation by a distance of $$\frac{k \cdot \lambda}{8} \ (k = 1, 3, 5, \ldots)$$

The combination of two semiconducting surfaces fixed to a spacer element will produce substantially no reflection because the reflections of the individual semiconducting surfaces cancel each other out owing to the carefully chosen distance apart. Consequently the entire modulator will produce virtually no reflection.

The situation becomes different if one of the semiconducting surfaces is illuminated by photons capable of creating free charges in the semiconducting material. Significant reflection will occur as $$\sigma > \frac{2\pi c \epsilon}{\lambda}$$

where $\sigma$ is the conductivity of the semiconducting material caused by the photoelectric effect, c the speed of light, $\epsilon$ the dielectric constant of the semiconducting material, and $\lambda$ the wavelength of the microwave radiation.

To utilize this physical effect, light-emitting diodes 24, 25, 26, 27 are provided to illuminate, respectively, the semiconducting surfaces 18, 19, 20 and 21 through the holes 28, 29, 30, 31 in the transmission line. These light-emitting diodes may be replaced by semiconductor lasers. The holes may be provided with light conductors.

When we apply a current $I_d$ to the light-emitting diode 24, the semiconducting surface 18 is illuminated via the hole 28. Semiconducting surface 18 then gives off a reflection, the relative phase of which we situate in the complex plane along the positive x axis. The magnitude of the reflection as a function of the current $I_d$ depends on several parameters: the type of the light-emitting diode, the carrier lifetime of the silicon, the surface recombination rate of the silicon. It is certain that for the reflection R the following applies:

$R = f(I_d)$ with f rising monotonously.

The selection of the parameters will be discussed later.

In the manner outlined above we can cause, by applying a current $I_d$ to the light-emitting diode 25, a reflection at semiconducting surface 19; because of the path length difference of $$\frac{k \cdot \lambda}{4} \ (k = 1, 3, 5, \ldots)$$

the reflection is situated in the complex plane along the negative real axis. Likewise, a current $I_d$ through light-emitting diode 26 will cause a reflection which is situated in the complex plane along the positive imaginary axis. A current $I_d$ through light-emitting diode 27 will cause a reflection which is situated in the complex plane along the negative imaginary axis.

To realise a reflection of specified phase and amplitude, we resolve the reflection into a real part and an imaginary part. The real part is effected by a current $I_d$ through light-emitting diode 24 or light-emitting diode 25, depending on the specified reflection being situated in the first or fourth quadrant of the complex plane, or, in the second or third quadrant.

The imaginary part is effected by a current $I_d$ through light-emitting diode 26 or light-emitting diode 27, depending on the specified reflection being situated in the first or second quadrant of the complex plane, or, in the third or fourth quadrant.

Because always one at most of the two light-emitting diodes 24, 25 draws current, it is possible to connect them in antiparallel. Then, a positive control current causes a reflection along the positive real axis, and a negative control current causes a reflection along the negative real axis. Likewise, connecting the light-emitting diodes 26, 27 in antiparallel achieves a control input which in the case of a positive control current effects a reflection along the positive imaginary axis and in the case of a negative control current effects a reflection along the negative imaginary axis. In this way, control of the vector modulator by the amplifiers 8a, 8b is a simple matter. The amplifiers need to be dimensioned such that they control the light-emitting diodes 24, 25, 26, 27 through current, control through voltage adversely influencing the operation of the closed loop because of the threshold voltages of the light-emitting diodes 24, 25, 26, 27.

Figure 3:
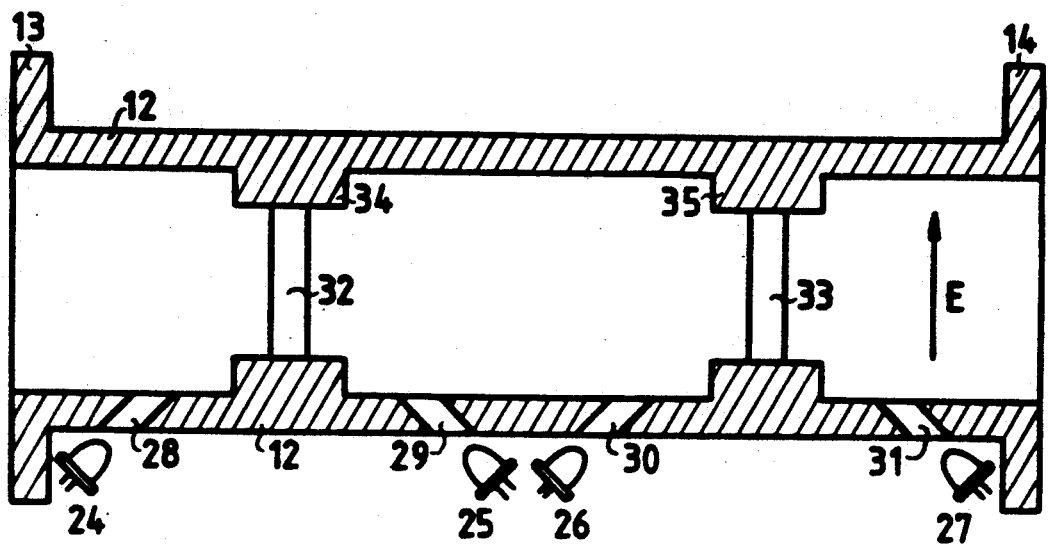
FIG. 3 is a cross-section of an alternative embodiment of the vector modulator.

In FIG. 3 an alternative embodiment of the vector modulator 4 is represented. The vector modulator 4 is accommodated in a transmission line 12 having connecting flange 13 as its input and connecting flange 14 as its output. The adjustable reflection occurs at two semiconducting surfaces 32, 33 each of a thickness such that the reflections of microwave radiation of the front and the rear exhibit a phase difference of 180°. For semiconducting material having a relative dielectric constant $\epsilon_r$ this means that the thickness is substantially $$\frac{k \cdot \lambda}{4 \sqrt{\epsilon_r}} \ (k = 1, 3, 5, \ldots)$$

The semiconducting surfaces 32, 33 are shifted, along the propagation direction of the microwave radiation in the transmission line, over a distance of substantially $$\frac{k \cdot \lambda}{8} \ (k = 1, 3, 5, \ldots)$$

relative to each other.

Entirely analogously to the previously described embodiment, the alternative embodiment is provided with light-emitting diodes 24, 25, 26, 27 and holes 28, 29, 30, 31 in the transmission line which, together with the front and rear of the semiconducting surfaces 32, 33, can realise any required reflection.

When the semiconducting surfaces 32, 33 are not illuminated they will, because of their usually high dielectric constant $\epsilon_r$, cause a considerable reflection. To prevent this, they are embedded in $\lambda/4$ adapters 34, 35, according to a well-known technique in the field of microwaves, involving the compensation of a disturbance in a transmission line by an intentionally introduced second disturbance, which causes a reflection of equal amplitude but with a 180° phase difference.

Among the parameters to be selected, an important one is the carrier lifetime of the semiconducting material used. A short carrier lifetime enables a vector modulator to be realised which has a fast step response. Two drawbacks are attached to this. A short carrier lifetime requires a larger control power for the light-emitting diodes 24, 25, 26, 27. Moreover it increases the risk that noise and interferences, penetrating into the control lines of the light-emitting diodes 24, 25, 26, 27, occasion a noise modulation of the microwave radiation which is applied to the microwave load 3. Particularly if the microwave load 3 is formed by an antenna for a CW radar installation, noise modulation becomes a serious problem.

A very economical embodiment of the vector modulator is obtained when the semiconducting material is chosen such that the closed loop bandwidth is determined by the carrier lifetime of the semiconducting material. This obviates the need for the low-pass filters 9a, 9b, and makes the vector modulator substantially unsusceptible to high-frequency noise and interferences in the control lines.

If a semiconducting material is chosen which has a long carrier lifetime, account has to be taken with an additional recombination mechanism, the surface recombination. This effect can be minimized through the etching of the semiconducting surfaces, which is an established technique in the field of semiconductor physics. This technique may be combined with the application of an anti-reflection coating on the semiconducting surfaces, without which 40% of the incident light is reflected.

I claim:

1. Microwave vector modulator provided with a transmission line, to an input of which microwave radiation can be applied, and adjustable reflection means for reflecting to the input at least part of the microwave radiation applied to the input, characterised in that the adjustable reflection means are provided with semiconducting surfaces incorporated in the transmission line and light-emitting means for the adjustable generation of a quantity of light with which the semiconducting surfaces are illuminated so as to obtain an adjustable reflection, wherein the semiconducting surfaces are substantially planar and placed substantially at right angles to a propagation direction of the microwave radiation in the transmission line.

2. Microwave vector modulator according to claim 1, characterised in that the semiconducting surfaces are provided with silicon.

3. Microwave vector modulator according to claim 2, characterised in that the light-emitting means are provided with at least one light-emitting diode.

4. Microwave vector modulator according to claim 2 characterised in that the light-emitting means are provided with at least one semiconductor laser.

5. Microwave vector modulator according to claim 3, characterised in that the light generated by the light-emitting means is passed to the semiconducting surfaces with the aid of light conductors.

6. Microwave vector modulator according to claim 1, whereby the vector modulator forms an adjustable reflector for microwave radiation with a wavelength of substantially λ, characterised in that the vector modulator is equipped with a first pair of semiconducting surfaces provided with a spacer device, and a second pair of semiconducting surfaces provided with a spacer device, that the length of each spacer device is substantially k.λ/4 (k=1, 3, 5, ... ), and that the distance between the first pair and the second pair is substantially k.λ/8 (k=1, 3, 5, ... ).

7. Microwave vector modulator according to claim 6, characterised in that each semiconducting surface of a pair of semiconducting surfaces is provided with a group of light-emitting means, and that always one at most of the two groups emits light.

8. Microwave vector modulator according to claim 1, whereby the vector modulator forms an adjustable reflector for microwave radiation with a wavelength of practically λ, using semiconducting material having a dielectric constant $\epsilon_r$, characterised in that the vector modulator is provided with two semiconducting surfaces each having a thickness of practically $$\frac{k \cdot \lambda}{4 \sqrt{\epsilon_r}} \ (k = 1, 3, 5, \ldots)$$

and an in-between distance of $$\frac{k \cdot \lambda}{8} \ (k = 1, 3, 5, \ldots).$$

9. Microwave vector modulator according to claim 8, characterised in that each semiconducting surface is provided with two groups of light-emitting means, and that always one at most of the two groups emits light.

10. Microwave vector modulator according to claim 7 or 9, characterised in that each group of light-emitting means consists of a light-emitting diode and that the two light-emitting diodes are connected in antiparallel.

11. Device for the matching of a microwave load, provided with a microwave source, the microwave load, a transmission line through which microwave radiation generated by the microwave source is applied to the microwave load, a vector modulator incorporated in the tranmission line, with which an adjustable part of the microwave radiation generated by the microwave source can be reflected, and a quadrature detector to which at least part of the microwave radiation reflected by the microwave load and vector modulator is applied and to which also part of the microwave radiation generated by the microwave source is applied, whereby the quadrature detector controls the vector modulator so that a closed loop is obtained with which the microwave radiation reflected by the microwave load and vector modulator is cancelled out, characterised in that the vector modulator is provided with semiconducting surfaces incorporated in the transmission line and light-emitting means for the adjustable generation of a quantity of light with which the semiconducting surfaces are illuminated so as to obtain an adjustable reflection.

12. Device according to claim 11, characterised in that the semiconducting surfaces are placed substantially at right angles to the propagation direction of the microwave radiation in the transmission line.

13. Device according to claim 11 or 12, characterised in that the semiconducting surfaces are provided with silicon.

14. Device according to claim 13, characterised in that the light-emitting means are provided with at least one light-emitting diode.

15. Device according to claim 13, characterised in that the light-emitting means are provided with at least one semiconductor laser.

16. Device according to one of claim 14, characterised in that the light generated by the light-emitting means is passed to the semiconducting surfaces with the aid of light conductors.

17. Device according to claim 12, whereby the microwave source generates microwave radiation with a wavelength of substantially λ, characterised in that the vector modulator is equipped with a first pair of semiconducting surfaces provided with a spacer device, and a second pair of semiconducting surfaces provided with a spacer device, that the length of each spacer device is substantially k.λ/4 (k=1, 3, 5, ... ), and that the distance between the first pair and the second pair is substantially k.λ/8 (k=1, 3, 5, ... ).

18. Device according to claim 17, characterised in that each semiconducting surface of a pair of semiconducting surfaces is provided with a group of light-emitting means, and that always one at most of the two groups emits light.

19. Device according to claim 12, whereby the microwave source generates microwave radiation with a wavelength of practically λ, using semiconducting material having a dielectric constant $\epsilon_r$, characterised in that the vector modulator is provided with two semiconducting surfaces each having a thickness of practically $$\frac{k \cdot \lambda}{4 \sqrt{\epsilon_r}} \quad (k = 1, 3, 5, \ldots)$$

and an in-between distance of $$\frac{k \cdot \lambda}{8} \quad (k = 1, 3, 5, \ldots).$$

20. Device according to claim 19, characterised in that each semiconducting surface is provided with two groups of light-emitting means, and that always one at most of the two groups emits light.

21. Device according to claim 18 or 20, characterised in that each group of light-emitting means consists of a light-emitting diode and that the two light-emitting diodes are connected in antiparallel.

22. Microwave vector modulator according to claim 4, characterized in that the light generated by the light-emitting means is passed to the semiconducting surfaces with the aid of light conductors.

23. Device according to claim 15, characterised in that the light generated by the light-emitting means is passed to the semiconducting surfaces with the aid of light conductors.

24. A microwave vector modulator comprising:
a transmission line with an input for receiving input microwave radiation;
a plurality of substantially planar semiconductor surfaces incorporated in the transmission line; and
a plurality of light-emitting elements for emitting light to impinge on a corresponding of the plurality of semiconductor surfaces, wherein said plurality of semiconductor surfaces reflect the input microwave radiation based on a quantity of light emitted from the plurality of light-emitting elements;
wherein the plurality of semiconductor surfaces are placed substantially at right angles to a propagation direction of the input microwave radiation in the transmission line.

25. The microwave vector modulator according to claim 24, wherein the plurality of semiconducting surfaces comprise silicon.

26. The microwave vector modulator according to claim 24, wherein the plurality of light-emitting means are provided with at least one light-emitting diode.

27. The microwave vector modulator according to claim 24, wherein the plurality of light-emitting means are provided with at least one semiconductor laser.

28. The microwave vector modulator according to one of claims 24 or 25, wherein the light emitted by the plurality of light-emitting means passes to the plurality of semiconducting surfaces through light conductors.

29. The microwave vector modulator according to claim 24, wherein the vector modulator forms an adjustable reflector for microwave radiation with a wavelength of substantially λ, and the vector modulator is equipped with a first pair of semiconducting surfaces provided with a spacer device, and a second pair of semiconducting surfaces provided with a spacer device, the length of each spacer device is substantially k.λ/4 (k=1, 3, 5, ... ), and the distance between the first pair of semiconductor surfaces and the second pair of semiconductor surfaces is substantially k.λ/8 (k=1, 3, 5, ... ).

30. The microwave vector modulator according to claim 29, wherein each semiconducting surface of a pair of semiconducting surfaces is provided with a group of light-emitting means, and that always one at most of the two groups emits light.

31. The microwave vector modulator according to claim 24, wherein the vector modulator forms an adjustable reflector for microwave radiation with a wavelength of practically λ, the plurality of semiconductor surfaces comprise semiconducting material having a dielectric constant $\epsilon_r$, wherein the vector modulator is provided with two semiconducting surfaces each having a thickness of practically $$\frac{k \cdot \lambda}{4 \sqrt{\epsilon_r}} \quad (k = 1, 3, 5, \ldots)$$

and an in-between distance of $$\frac{k \cdot \lambda}{8} \quad (k = 1, 3, 5, \ldots).$$

32. The microwave vector modulator according to claim 31, wherein each of the plurality of semiconductor surfaces is provided with two groups of light-emitting means, and that always one at most of the two groups emits light.

33. The microwave vector modulator according to one of claims 30 or 32, wherein each group of light-emitting means comprises a light-emitting diode and two light-emitting diodes are connected in antiparallel.

* * * * *